US006940654B1

(12) United States Patent
Tang

(10) Patent No.: US 6,940,654 B1
(45) Date of Patent: Sep. 6, 2005

(54) LENS ARRAY AND METHOD OF MAKING SAME

(76) Inventor: Yin S. Tang, 201 Rockview, Irvine, CA (US) 92612

( * ) Notice: Subject to any disclaimer, the term of this patent is extended or adjusted under 35 U.S.C. 154(b) by 0 days.

(21) Appl. No.: 10/797,809

(22) Filed: Mar. 9, 2004

(51) Int. Cl.[7] .................. G02B 27/10; B29D 11/00; G03C 5/00; H01L 27/148; H01L 21/00
(52) U.S. Cl. .................. 359/619; 359/455; 264/1.7; 430/321; 427/164; 257/233; 438/69; 438/70
(58) Field of Search .................. 359/619, 626, 359/455, 293; 264/1.32, 1.7; 430/321, 50; 427/164; 257/432, 233; 438/69, 70

(56) References Cited

U.S. PATENT DOCUMENTS

| 6,221,687 B1 * | 4/2001 | Abramovich ............... 438/70 |
| 6,362,498 B2 * | 3/2002 | Abramovich ............... 257/233 |
| 6,535,338 B2 * | 3/2003 | Nishikawa ................. 359/619 |
| 6,597,509 B2 * | 7/2003 | Takakuwa et al. .......... 359/619 |
| 6,730,459 B2 * | 5/2004 | Nishikawa et al. ......... 430/321 |
| 6,781,762 B2 * | 8/2004 | Ozawa ...................... 359/619 |
| 6,804,062 B2 * | 10/2004 | Atwater et al. ............ 359/626 |
| 6,842,289 B2 * | 1/2005 | Nishikawa et al. ......... 359/619 |

* cited by examiner

*Primary Examiner*—Loha Ben
(74) *Attorney, Agent, or Firm*—MacPherson Kwok Chen & Heid LLP; Tom Chen

(57) ABSTRACT

Systems and methods are provided for a lens or microlens array or non-spherical lens with or without an integrated sensor unit. A dielectric between a substrate and a lens material has curved recesses, which are filled in by the lens material. Light enters the lens material layer and is focused by the curved recess portions.

39 Claims, 10 Drawing Sheets

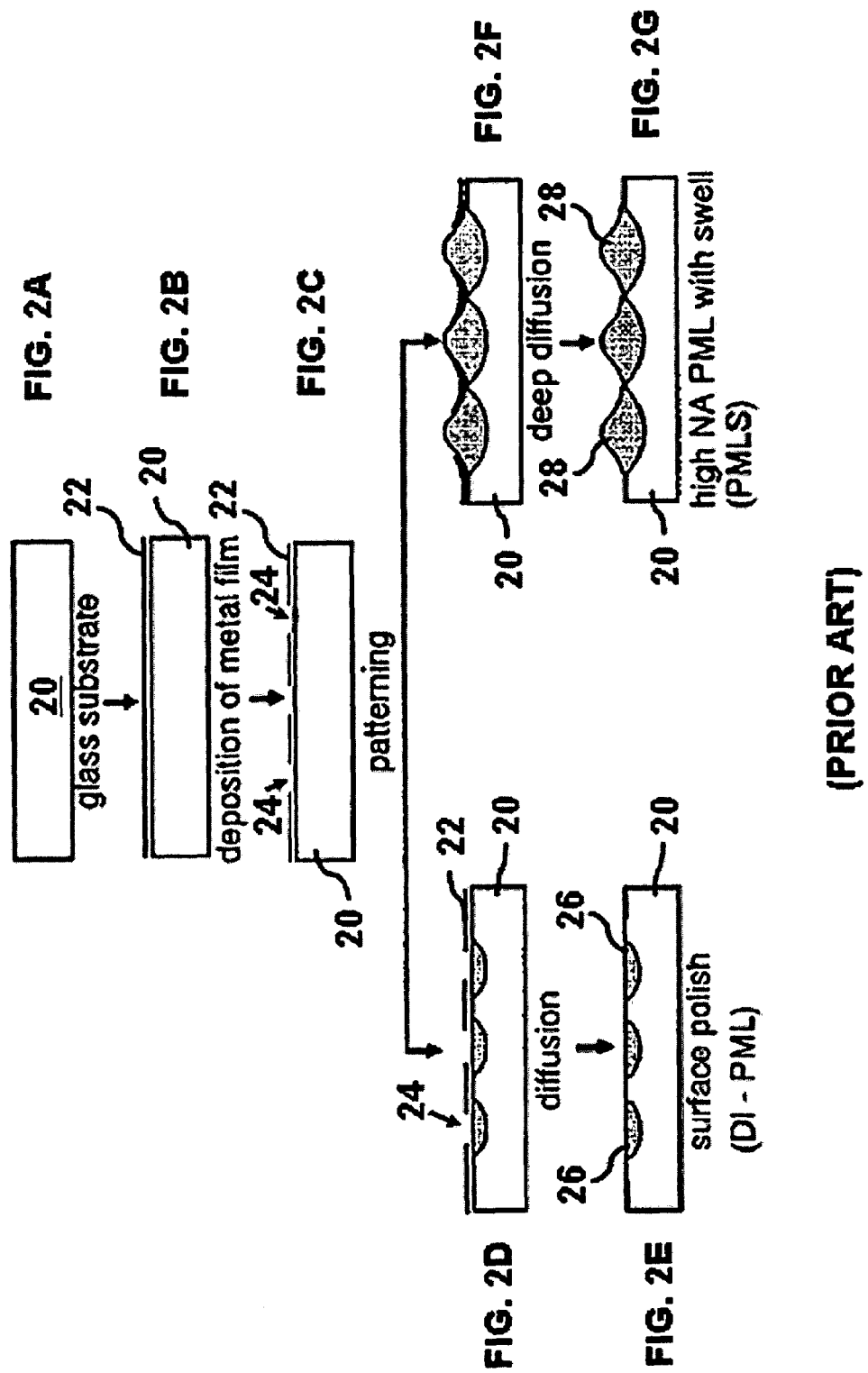

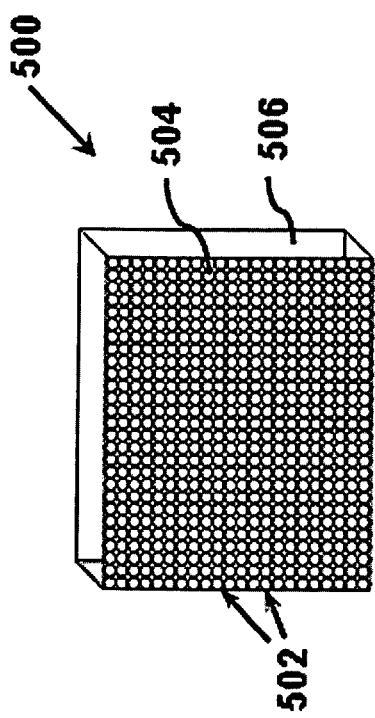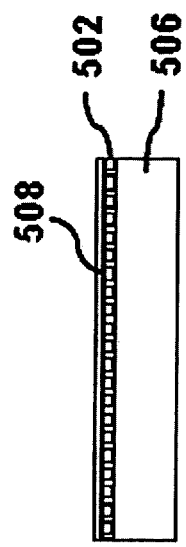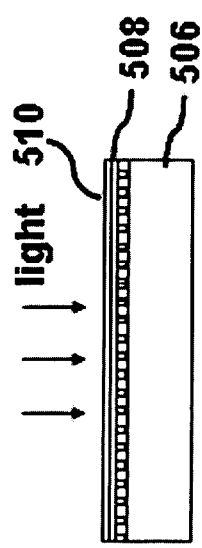
FIG. 5A
FIG. 5B
FIG. 5C

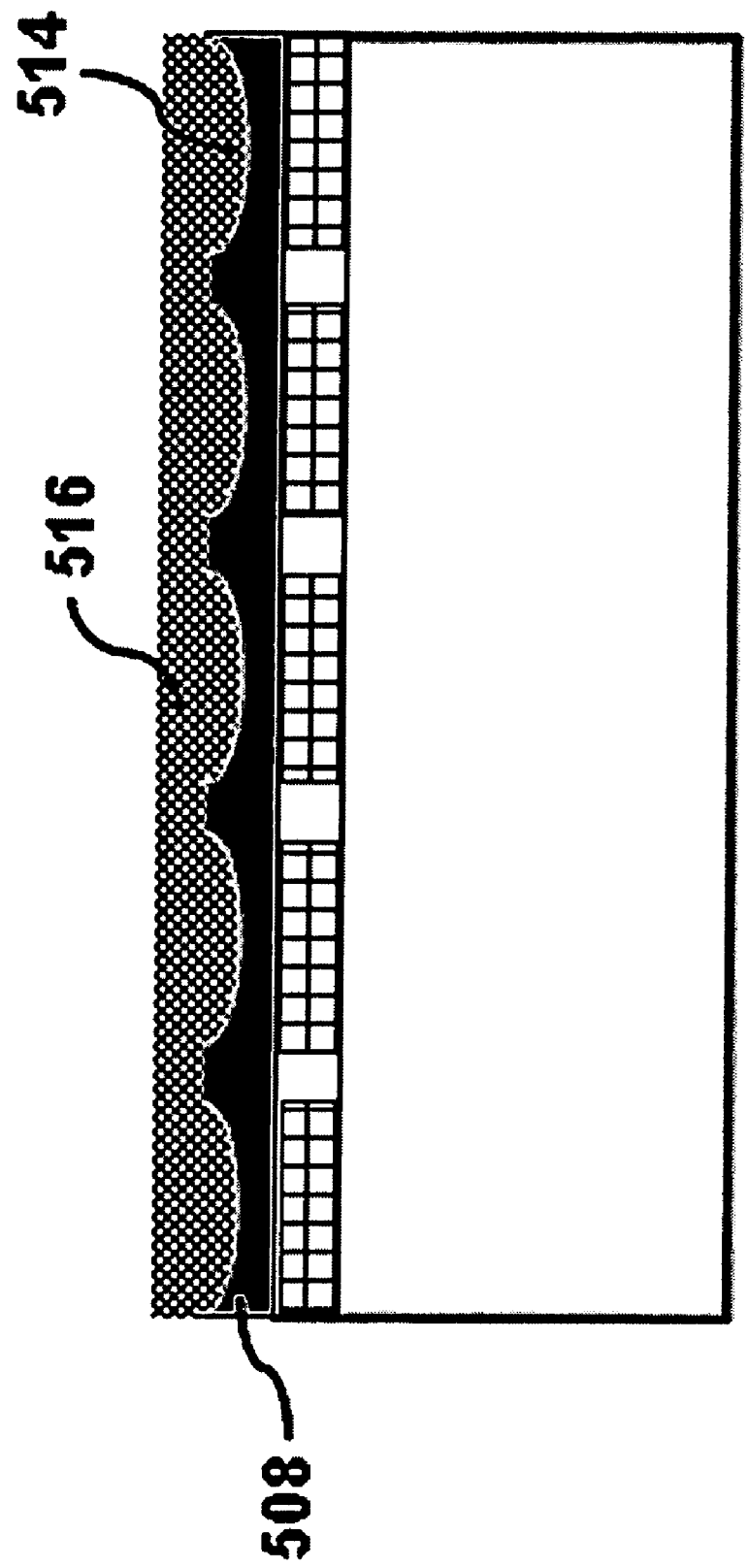

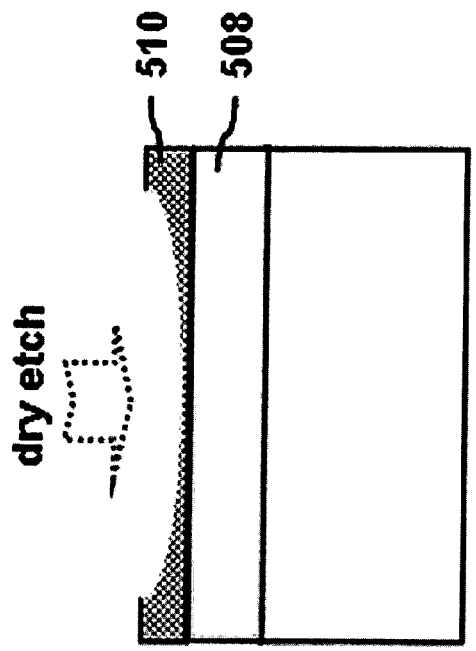
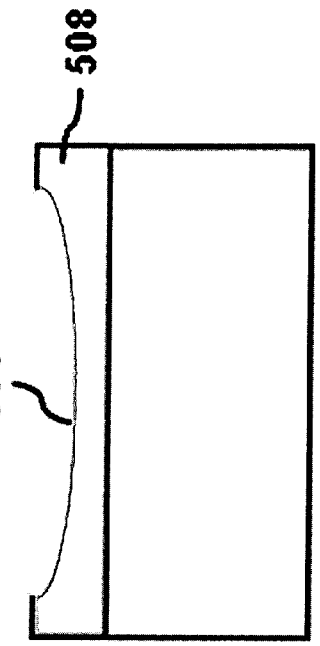
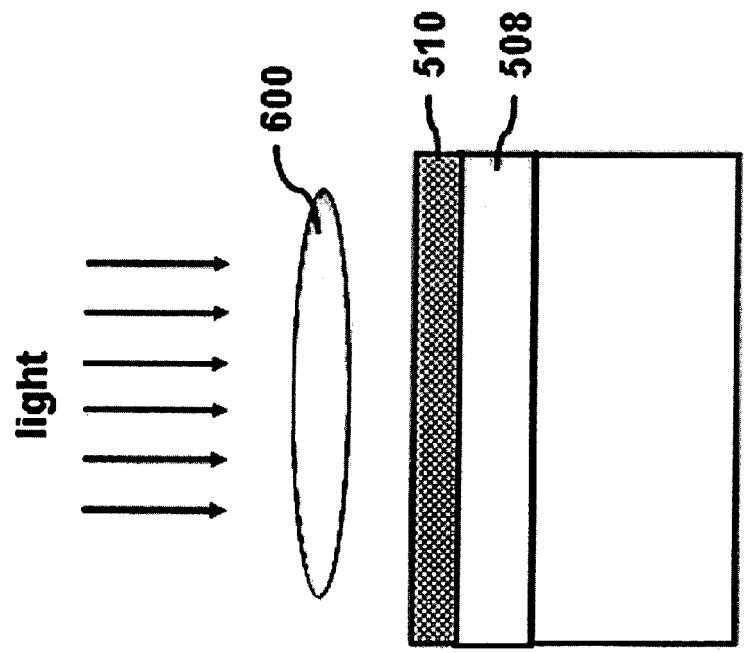
FIG. 7B
FIG. 7C
FIG. 7A

LENS ARRAY AND METHOD OF MAKING SAME

BACKGROUND

1. Field of the Invention

The present invention relates generally to microlens arrays and optical lenses, and more particularly to methods for manufacturing microlens arrays or non-spherical lenses.

2. Related Art

Microlens arrays provide optical versatility in a miniature package for imaging applications. Traditionally, a microlens is defined as a lens with a diameter less than one millimeter; however, a lens having a diameter as large as five millimeters or more has sometimes also been considered a microlens.

There are many conventional methods for manufacturing microlens arrays, such as using reflow or diffusion. FIGS. 1A–1C show a typical sequence of steps for making a microlens array by depositing material, patterning, and reflowing. In FIG. 1A, a photosensitive layer 10, such as a photosensitive resin, is formed on a planarization layer 12 over a silicon substrate (not shown). The material of the photosensitive layer is used to form the microlens array. In FIG. 1B, photosensitive layer 10 is patterned to form an array of shapes, such as rectangles, stripes, or squares 14, where the shapes are located where the individual microlenses will be formed. Patterning, for example, can be with a conventional mask and photoresist process, where a photoresist is deposited on photosensitive layer 10, exposed through a mask having opaque areas, developing (or removing) selected portions of the photoresist, and etching areas of photosensitive layer 10 left exposed by the photoresist. Squares 14 are then heated sufficiently to cause them to reflow, thereby forming an array of semi-spherical microlenses 16, as shown in FIG. 1C.

However, microlens arrays made by thermal reflowing, as described above, have several disadvantages. Typically, photosensitive resins contain components which absorb proportionally more light in the blue region of the visible spectrum. As a result, the color spectrum is distorted, producing an image that is more "yellowish" than it should be. This color distortion increases with time due to oxidation of the resin. Another disadvantage is that the resolution with which the photosensitive resin can be patterned is limited by the thickness of the resin layer. The thicker the resin layer, the farther apart the microlenses in the array, which reduces the light collection efficiency of the array. On the other hand, the resin layer must be thick enough so that, when reflowed, the sag of the resultant microlenses is sufficient to cause the desired focusing effect. Consequently, it is difficult to obtain the highest possible collection efficiency with microlens arrays fabricated in this manner. Yet another disadvantage results from the fact that as the curvature radius of the microlens becomes small, the incident light is focused on a point near the microlens. Thus, the photosensitive layer is patterned to be square or rectangular in shape according to the shape of a cell, using a mask that is simply divided into opaque regions and light-transmissive regions, and is thermally treated to form a microlens. Thus, a curvature radius of the microlens is decreased. Moreover, because a microlens formed in a rectangular shape has a significant difference between its curvature radius in the width and the length directions, it is difficult to focus incident light on the corresponding photodiode without error, and a part of the light is focused on the planarization layer or color filter layer between the photodiode and the microlens, causing loss of light and deterioration of sensitivity and resolution.

Another conventional method of forming microlens arrays is by diffusion, such as described in "Light Coupling Characteristics of Planar Microlens", by M. Oikawa et al., Proc. SPIE, 1544, 1991, pp. 226–237, which is incorporated by reference in its entirety. FIGS. 2A–2G show steps for forming a microlens array using two types of diffusion. In FIG. 2A, a glass substrate 20 is provided. In FIG. 2B, a metal film 22 is deposited on glass substrate 20. Metal film 22 is then patterned, such as with conventional processes, to remove portions 24 where individual microlenses are to be formed, as shown in FIG. 2C. FIGS. 2D and 2E show one type of further processing, where the exposed areas 24 are diffused with an appropriate dopant and energy (FIG. 2D) and then the remaining metal is removed and the surface is polished, such as with a chemical or machine polish, to form microlenses 26 (FIG. 2E). FIGS. 2F and 2G show another type of further processing, where ions, protons, or other suitable molecules are used to bombard (e.g., with low energy) (FIG. 2F) and diffuse into substrate 20 and the remaining metal portions removed and the irradiated portions "swelled" (FIG. 2G), such as with an organic vapor, to form microlenses 28. The result is a high numeral aperture planar microlens array. One disadvantage to forming microlens arrays using diffusion is that control of the thickness along the optical axis is limited.

Microlens arrays are typically used with an underlying array of sensors, such as complementary metal oxide semiconductor (CMOS) or charge couple device (CCD) sensors, to form an imaging device. The microlenses collect and focus light onto corresponding sensors. The microlenses significantly improve the light sensitivity of the imaging device by collecting light from a large light collecting area and focusing it on a small light sensitive area of the sensor (i.e., pixel). One conventional method of generating an image signal is shown in FIG. 3. Light rays 30 are collected and focused by a microlens layer 32 comprising an array of microlenses 34 overlying a planarization layer 36, such as formed by processes described above. After passing through planarization layer 36, light rays 30 are filtered by color filters 38 in a filter layer 40, with each color filter allowing only light of a specific color to pass, such as red, green, and blue (RGB). Light through the filters are then passed through a sensor layer 42, comprising an array of sensors 44, such as photodiodes or CCD devices. A processor (not shown) combines signals from the sensors to create a color image.

Such an arrangement of microlenses, filters, and sensors has several disadvantages. Several processing steps are needed to form the separate microlens layer 32, filter layer 40, and sensor layer 42, which increase cost and time. The layers also increase the separation between the microlenses and the sensors, which can increase crosstalk between pixels, due in part to light impinging on adjacent sensors instead of the desired sensor.

In addition to microlenses, high quality non-spherical lenses are also critical components to many applications in the imaging field. They are widely used in optical systems for controlling critical light propagation and correcting image color quality, such as in professional cameras and video imaging equipment. However, the fabrication of non-spherical lenses is complicated and can only be done through skilled manual operation by highly trained professionals. Unlike spherical lenses which can be manufactured quickly by using conventional machines, non-spherical or specially sized or shaped lenses are typically shaped and polished manually and frequently individually. This can be time consuming and costly.

Accordingly, there is a need for an improved lens, microlens, or array and method of manufacturing such, including non-spherical lenses, that overcomes the disadvantages of conventional lens arrays or non-spherical lenses and related processes, such as described above. Further, there is a need for an integrated microlens array and sensor array that overcomes the disadvantages as described above with conventional microlens/sensor devices.

SUMMARY

The present invention provides improved microlens arrays or non-spherical lenses and processes of forming microlens arrays or non-spherical lenses. In one aspect, the microlens array is formed on a sensor array, resulting in an integrated microlens/sensor device.

According to one embodiment, an array of sensors is first fabricated on a substrate. A dielectric layer, such as a spin-on polymer (e.g., polyimide) or an oxide (e.g., $SiO_2$) is deposited over the sensor array. A patterning photosensitive dielectric layer, such as a spin-on photoresist, is next formed over the dielectric layer. Selected portions of the patterning layer are removed to expose areas of the dielectric layer overlying the individual sensors where microlenses are to be formed. The exposed portions are then processed to form curved recesses, such as by using a wet etch, a grey-scale mask, or a shadow mask. The curved recesses may have a controlled shape and range from a shallow recess to a deep spherical recess, depending on the desired characteristics of the microlens. Remaining portions of the patterning layer are then removed. An inorganic lens material having a higher refractive index than the underlying dielectric layer, such as $SiO_2$, $SiO_xN_y$, $Si_3N_4$, $TiO_2$, or a polymer, is deposited over the dielectric layer to form an integrated array of microlenses and sensors. The layer of lens material may be polished, if desired.

In other embodiments, the dielectric layer can be deposited over any substrate and does not have to be a sensor array. In such embodiments, the process forms and/or can be used to make plastic molding templates to form individual spherical or non-spherical lenses, or an array of spherical and/or non-spherical microlenses of any desired shape or shapes. The process of the present invention allows a lens or microlens array to be formed with different shaped non-spherical and/or spherical lenses. This gives the lens manufacturer more flexibility to fabricate many additional types of lens arrays at discount prices.

The present invention provides numerous advantages over conventional microlens arrays and methods. Since the microlens array is formed directly onto the sensor array with fewer processing steps than conventional methods, microlens/sensor devices of the present invention are easier and less expensive to fabricate than conventional devices. The focal length of the microlenses can be controlled depending on the type of dielectric materials used for the microlenses and/or process control (i.e., curvature of the lens elements.)

The present invention also provides improved sensor sensitivity due to the ability to make non-spherical lenses using wet etching, grey-scale mask or shadow mask processing. Another advantage is that using non-organic lens materials extends the reliability or useful lifetime of the microlens. The color quality of the image produced by the sensor is also improved because the lens material does not have the adverse characteristics of resin-containing materials, which as discussed above, can absorb proportionally more blue light to make the image yellowier than desired. Yet another advantage the current invention provides is that the resulting microlens/sensor device is thinner and more resistant to environmental effects because the microlens array acts as a protection layer for the sensor elements.

The resulting microlens array may be used with devices for a variety of application, from a small display screen for a camera, a digital camera sensor, a personal digital assistant, or a laptop to a large display screen for a projection screen, a wall-sized display screen, or a billboard-sized display screen. The processing or fabrication of the array/sensor unit allows high throughput with consistent characteristics between each array/sensor unit.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 2A–2E show steps for forming a microlens array using one type of diffusion according to a conventional process;

FIGS. 2A–2C and 2F–2G show steps for forming a microlens array using another type of conventional process;

FIGS. 5A–5G show various stages of a process for fabricating a microlens/sensor array according to one embodiment;

FIGS. 7A–7C show various stages of a process for forming controlled curvature recesses using a grey scale mask according to one embodiment.

Embodiments of the present invention and their advantages are best understood by referring to the detailed description that follows. It should be appreciated that like reference numerals are used to identify like elements illustrated in one or more of the figures.

DETAILED DESCRIPTION

Figure 1A:
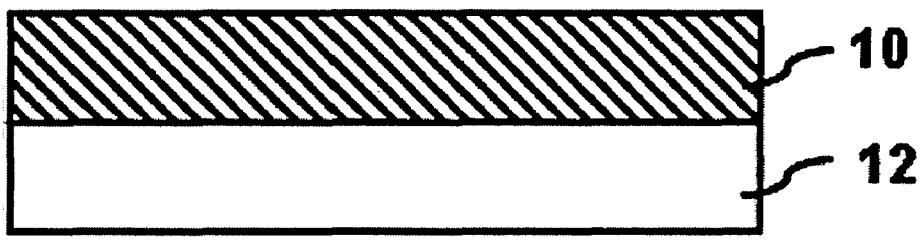
FIGS. 1A–1C show a typical sequence of steps for making a microlens array by reflowing according to a conventional process.
Figure 1B:
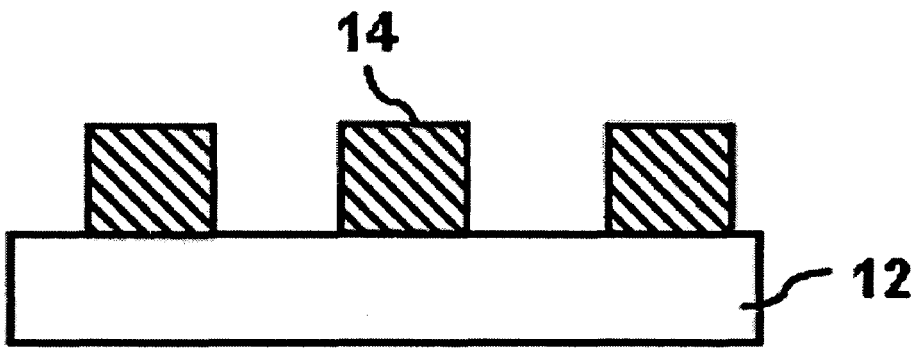
Figure 1C:
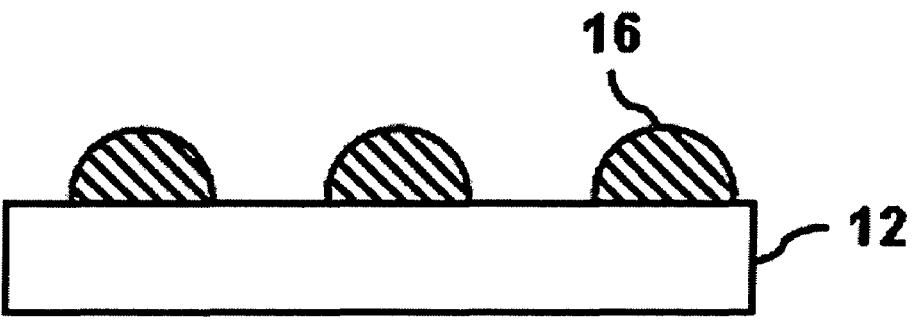
Figure 3:
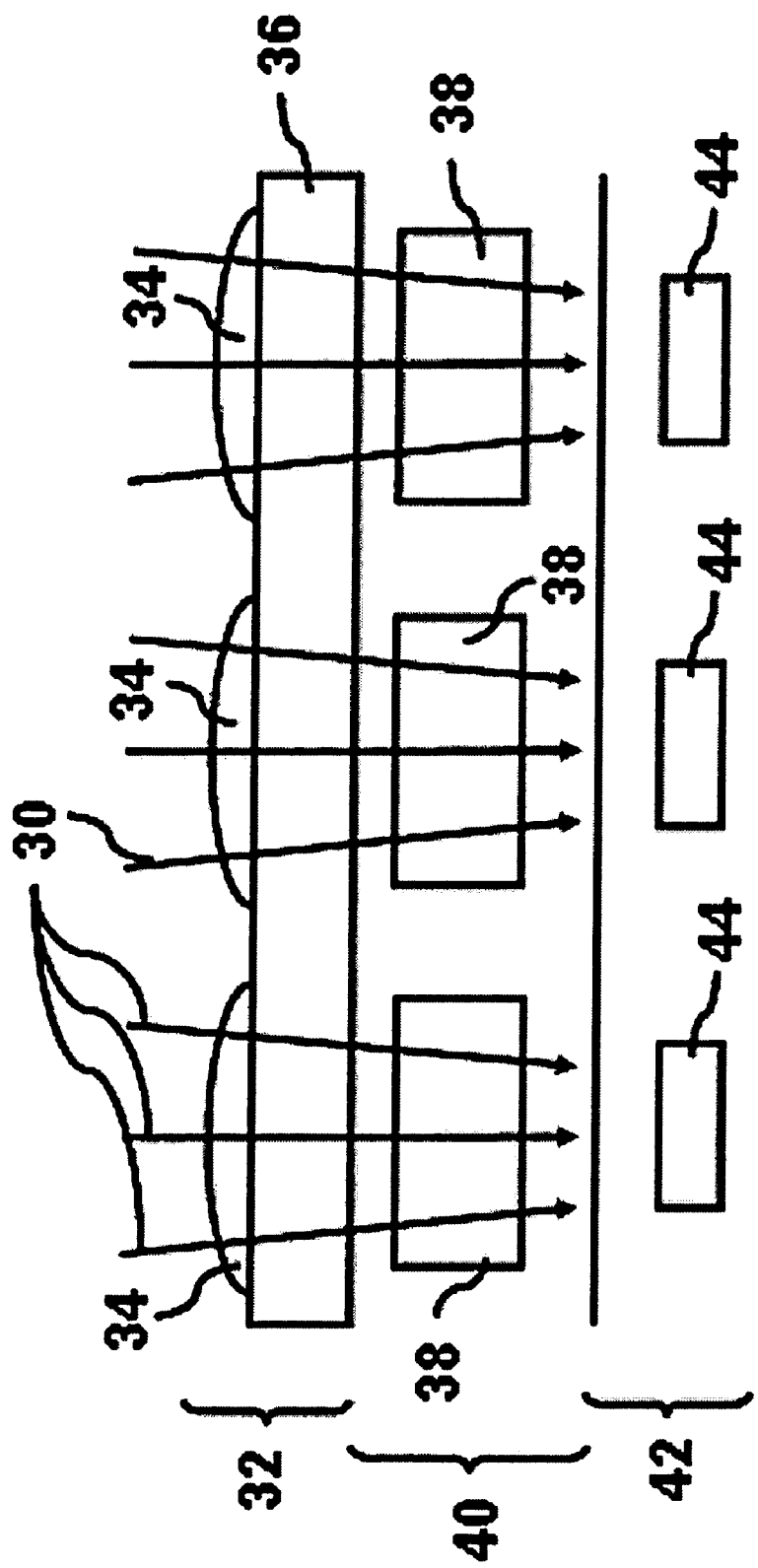
FIG. 3 shows one type of conventional microlens array and sensor array device.
Figure 4:
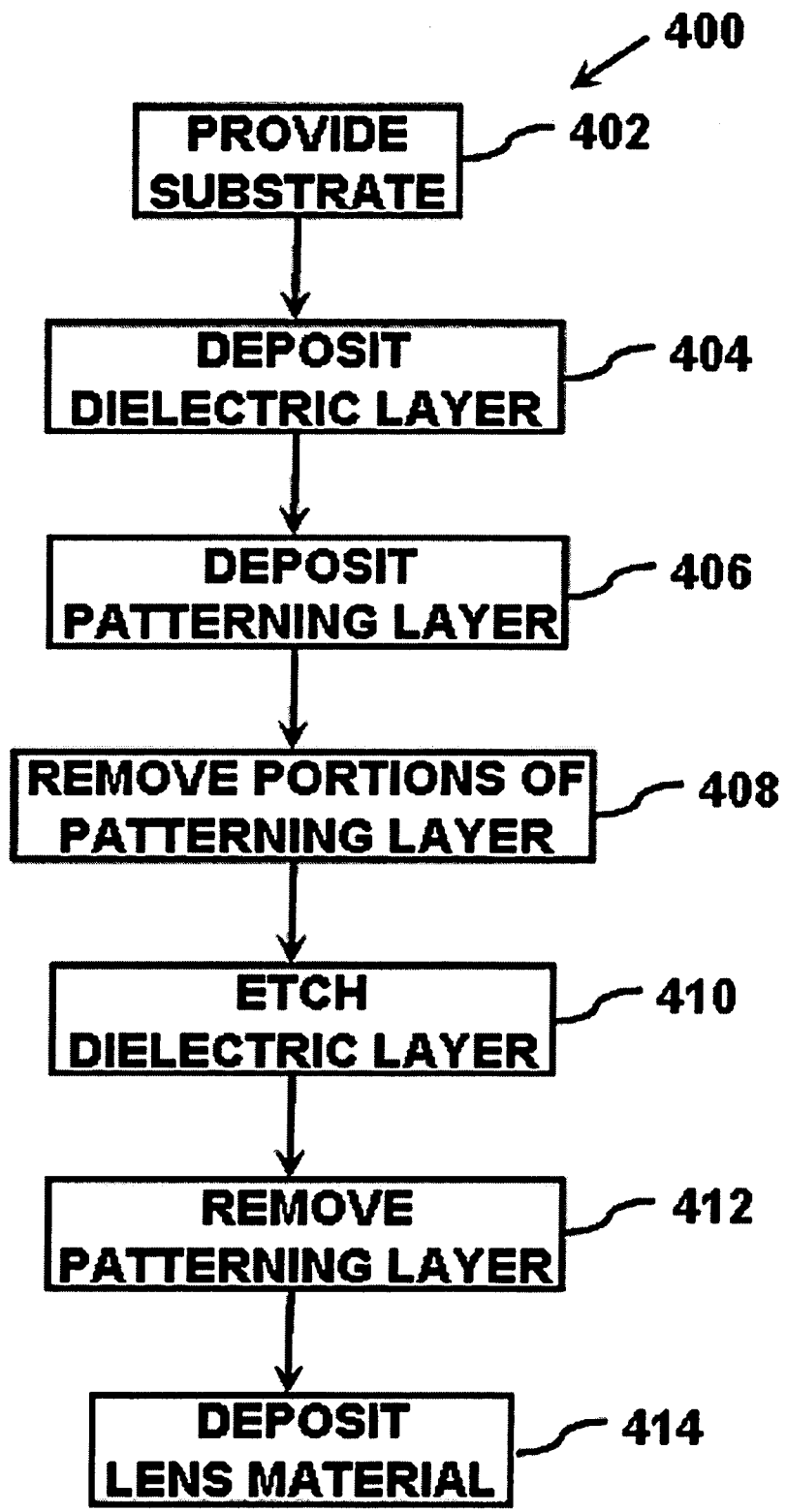
FIG. 4 is a flow chart showing a process for fabricating a microlens array onto a sensor array according to one embodiment of the present invention.

FIG. 4 is a flowchart illustrating a method 400 in accordance with an embodiment of the present invention for fabricating a microlens array or a non-spherical lens. A substrate is first provided in step 402, where the substrate may include an array of CMOS or CCD sensors. The sensor array may be any suitable size, ranging from small screen applications to large display devices. A dielectric layer is then deposited on the substrate in step 404. A patterning layer, such as a spin-on photoresist or other photosensitive material, is deposited on the dielectric layer in step 406.

Selected portions of the patterning layer are removed, such as by conventional photolithography processing, in step 408. The removed portions expose areas of the dielectric layer where the microlenses or non-spherical lenses are to be formed. With embodiments having a sensor array, the exposed areas correspond to locations of individual sensor elements.

In step 410, the exposed portions of the dielectric layer are selectively etched, such as with a wet etch, a grey scale mask, or shadow mask, to form controlled curved recesses. The curved recesses deepest in the center and taper up toward the sides or circumference. The etching does not remove all the dielectric material such that the underlying substrate or sensors are exposed. Further, the curved recesses can be any suitable shape, such as semi-spherical or non-spherical, depending on the application. The remaining portions of the patterning layer are removed in step 412, and the resulting template is ready for further processing steps or can be used for plastic molding of specially designed lenses. When the template is to be continued for further processing, a layer of inorganic lens material is deposited over dielectric layer, in step 414, to fill in the curved recesses. The lens material, in one embodiment, has a refractive index higher than that of the dielectric layer. Examples of suitable lens materials include, but are not limited to, $SiO_2$, $SiO_xN_y$, $Si_3N_4$, $TiO_2$, a polymer, or plastics in the case of plastic molding. The layer of lens material may then be polished if necessary.

Figure 5D:
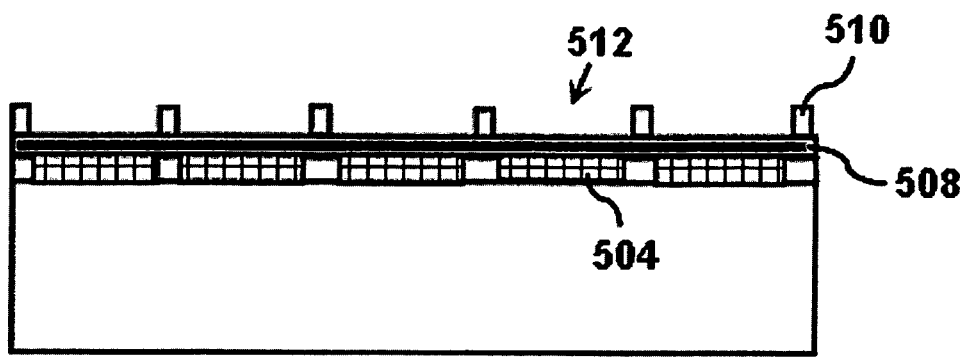

FIGS. 5A–5G show various stages of fabricating a microlens array according to one embodiment of the invention. FIG. 5A shows a top view of a substrate 500 onto which the microlens array will be formed. In one embodiment, substrate 500 is a glass or silicon substrate, in which the resulting device is a microlens array. In another embodiment, substrate 500 is a sensor array formed on top of a supporting substrate, such as glass or silicon, in which the resulting device is an integrated sensor/microlens array. The sensor array can be an array of CMOS or CCD sensors, such as photodiodes or other sensor elements. Fabrication of the sensor array is with conventional methods. FIG. 5A shows the embodiment where a sensor array 502 with individual sensor elements 504 is formed on a supporting substrate 506. A dielectric layer 508, such as an oxide (e.g., $SiO_2$, $TiO_2$), nitride (e.g., $SiO_xN_y$), spin-on polymer, is deposited on sensor array 502, as shown in FIG. 5B. The thickness of the dielectric layer 508 depends on specific application requirements. In one embodiment for integrated sensor/microlens array, dielectric layer 508 is between 1 $\mu$m and several millimeters thick. In another embodiment for individual non-spherical lens, dielectric layer 508 can be up to one centimeter or thicker.

Next, in FIG. 5C, a patterning layer 510 is deposited over dielectric layer 508, where patterning layer 510 will be used to expose portions of the dielectric layer where microlenses or non-spherical lenses will be formed. Patterning layer 510 is a photosensitive dielectric material and is selected based on the type of patterning process used. For example, for a photolithography process, patterning layer 510 can be a spin-on photoresist or other photosensitive material. The desired pattern can then be formed on patterning layer 510 by exposure through a photomask. The photomask, if the photoresist is positive, may have an array of circular openings, where the circular openings correspond to locations of the microlenses to be formed. If the microlenses are to have different shapes and/or sizes, the individual openings of the photomask can be adjusted accordingly. Exposed portions of patterning layer 510 are then removed to expose portions 512 of dielectric layer 508 where microlenses or non-spherical lenses are to be formed, as shown in FIG. 5D. With an underlying sensor array, portions 512 correspond to individual sensor elements 504.

Figure 5E:
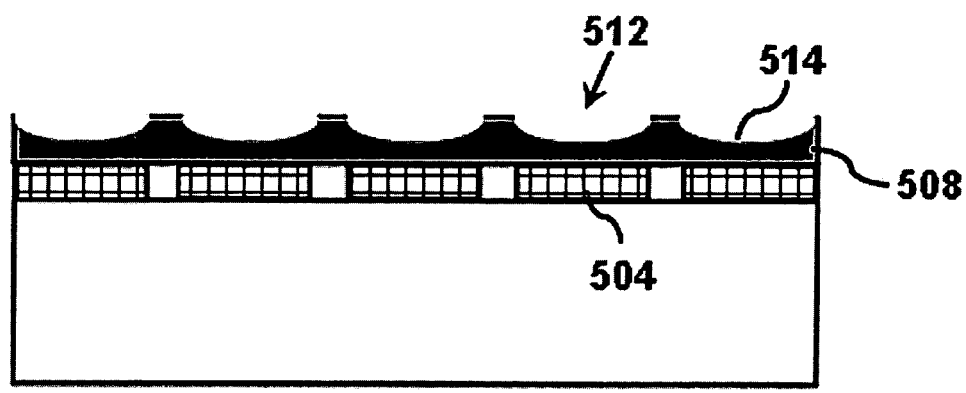
Figure 5F:
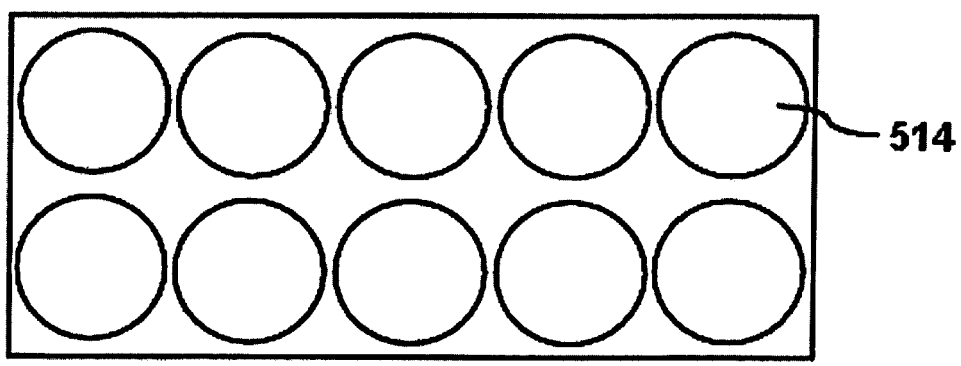

In FIG. 5E, exposed portions 512 of dielectric layer 508 are then etched to form curved recesses 514 overlying sensor elements 504. Curved recesses 514 can be semi-spherical, as shown in FIG. 5F, which is a top view of FIG. 5E. As noted above, the shape of individual curved recesses 514 can be varied according to the microlens application. Further, curved recesses 514 are formed, in one embodiment, by controlled etches, such as a wet etch or etching after patterning using a grey scale mask or shadow mask. Other etching processes for tapered etching may also be suitable with the present invention. The depth and taper of the etch also determines the optical characteristics, such as focal length, of the microlens or lens. Thus, by controlling the etch of the dielectric layer, different types of microlens arrays can be easily fabricated.

Figure 6A:
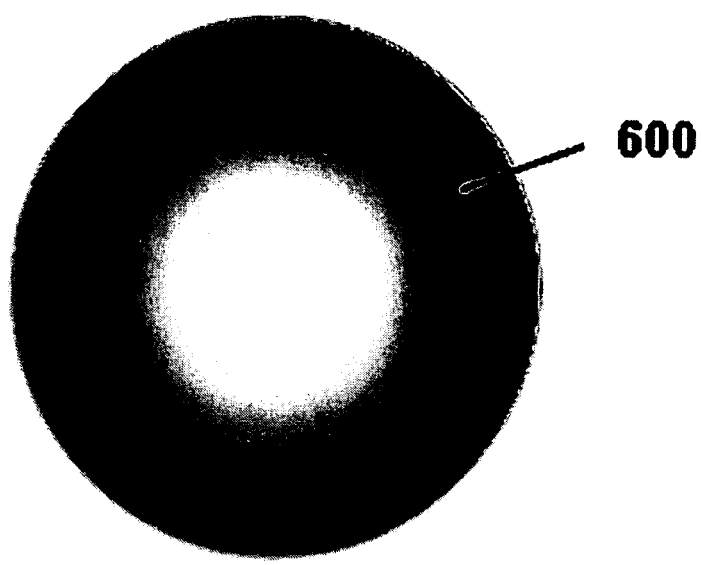
FIGS. 6A and 6B show a grey scale mask and characteristic of a grey scale mask, respectively, for use in one embodiment of the invention.
Figure 6B:
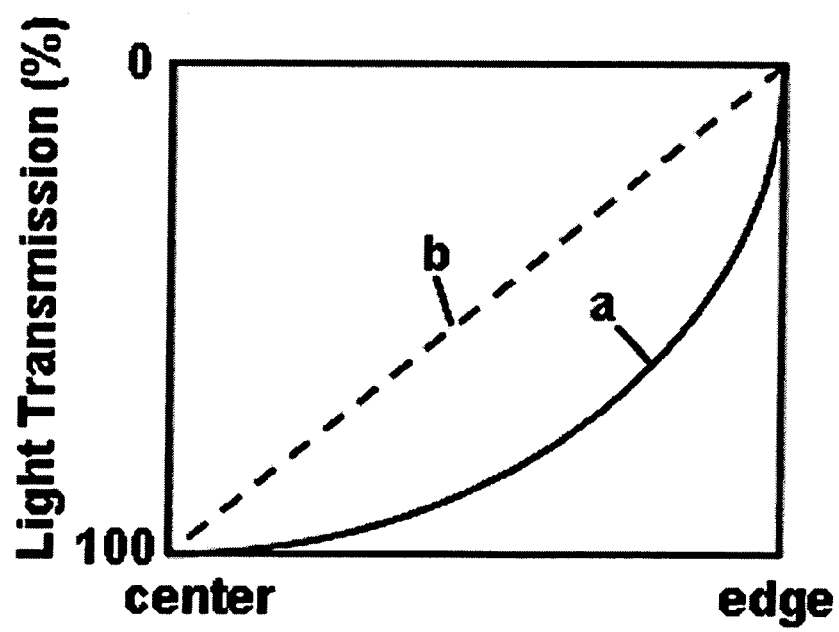

FIGS. 6A and 6B and 7A–7C show a method of forming controlled curved recesses using a grey scale mask process according to one embodiment. FIG. 6A shows an example of one opening 600 of a grey scale mask, where a typical grey scale mask will have many such openings 600 separated by opaque sections in between. A grey scale mask lets different amounts of light through different radius locations of the opening, such as shown in FIG. 6B. The degree of grey at different radii of the opening 600 on the grey scale mask determines the degree of light exposure at corresponding locations of the underlying photosensitive dielectric such as photoresist. As shown, less light passes through radially outward from the center of the opening, from a maximum of approximately 100% at the center to approximately 0% at the edge or outer circumference. The light transmission curve "a" can be any suitable shape for forming the desired microlens or lens.

FIGS. 7A–7C show a sequence of steps using a grey scale mask to form the controlled curved recesses. In FIG. 7A, a small portion of patterning layer 510 (such as a positive photoresist) is exposed through one opening 600 of a grey scale mask. Note that the portions between openings of the grey scale mask in the x-direction are opaque. Patterning layer 510 is developed and a dry etch is performed to transfer the exposed pattern to underlying dielectric layer 508, as shown in FIGS. 7B and 7C, to form curved recesses 514. Thus, by controlling the scale of the grey on the grey scale mask and dry etch, both spherical and non-spherical microlenses and lenses of different designs can be formed quickly and inexpensively.

Depending on the type of patterning and etch, curved recesses 514 may need to be treated to smooth out irregularities on the surface of the curved recesses. The "roughness" of the curved recesses should be small compared to the wavelength of the visible light. In one embodiment, the roughness should be approximately 1/10 the wavelength of the visible light. "Roughness" as defined herein refers to the distance or variation between peaks and troughs on the surface of the curved recesses. For example, when using dry etch to form curved recesses 514, a quick wet etch or wash may be added to smooth out any roughness of the surface of curved recesses 514. An alternative to the quick wet etch is to coat the surface of curved recesses 514 with a thin dielectric material of the same refractive index as underlying dielectric layer 508. Other suitable methods to smooth out the surface areas of the recesses 514 include those such as properly designed chemical mechanical polishing (CMP) and the like.

After forming curved recesses 514 of dielectric layer 508 (and polished if necessary), the structure can be used as a template for making plastic lenses through plastic molding, or to continue further processing for microlens/sensor integration. For plastic molding of lenses, multiple templates of the same pattern design and curved shapes or different design and shapes may be used depending on specific applications. When used for microlens/sensor integration, referring back to FIG. 5G, after curved recesses 514 of dielectric layer 508 are formed (and polished if necessary), a layer of transparent lens material 516 is deposited, as shown in FIG. 5G, to form the microlens array. In one embodiment, the lens material is inorganic and has a higher index of refraction than that of underlying dielectric layer 508. Some suitable materials for lens material 516 include dielectrics, such as $SiO_2$, $SiO_xN_y$, $Si_3N_4$, $TiO_2$, a polymer, plastics or a combination of them. Thus, depending on the microlens requirements, dielectric layer 508 and lens material 516 are selected accordingly. In one embodiment, the deposited thickness of lens material 516 is approximately the same as the depth at the center of the curved recesses or thicker depending on the application requirement. Use of inorganic lens materials, as opposed to resin-based reflow processes, produces lenses that create a truer color image. That is, there is no extra absorption in the blue spectrum, which produces yellowier images. Further, forming the microlens by deposition instead of diffusion provides better control of the lens shape and the thickness along the optical axis. After deposition of lens material 516, the upper surface can be polished to produce a flat smooth surface if necessary.

Figure 8:
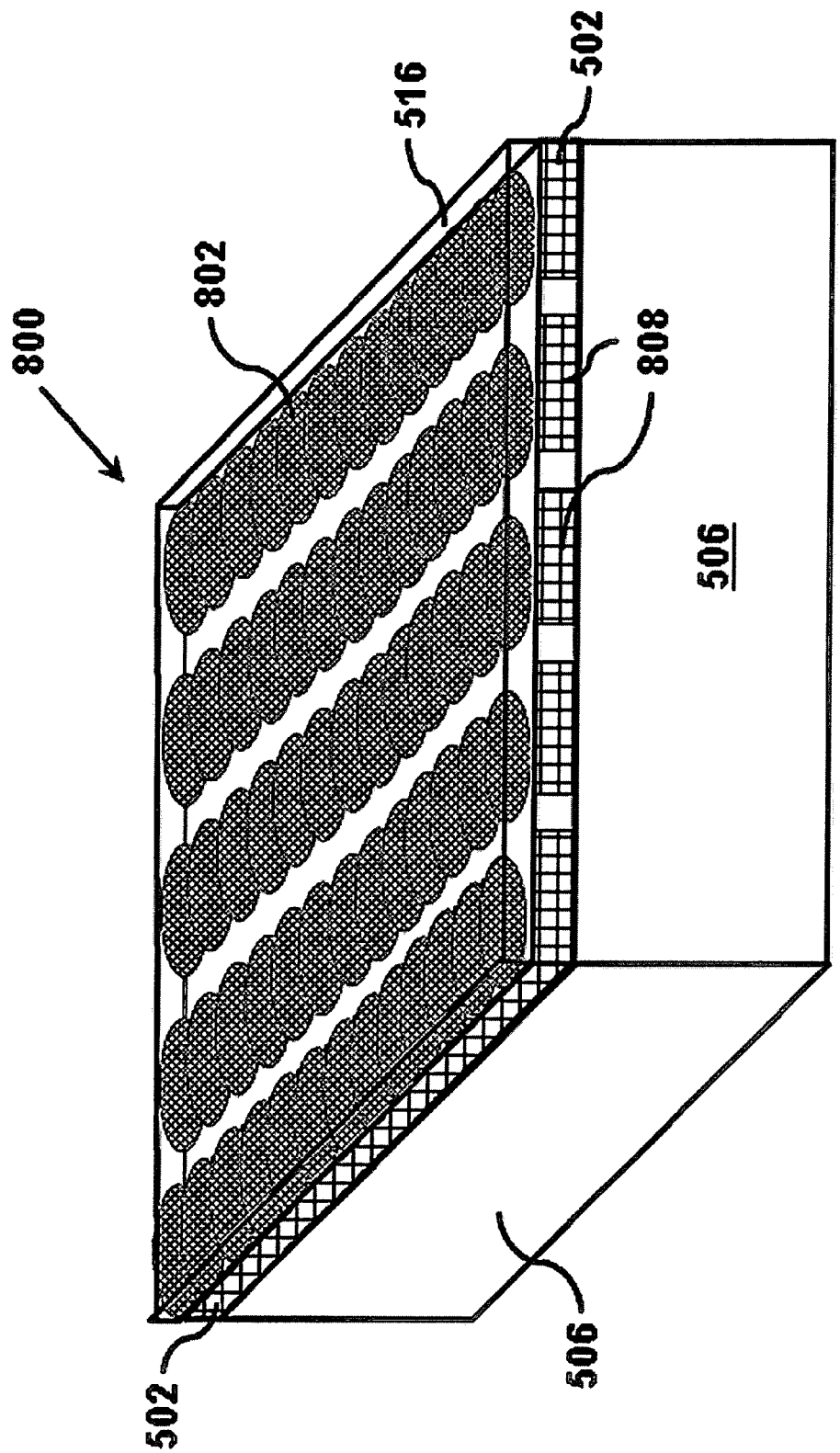
FIG. 8 is an angled view of a microlens array according to one embodiment of the present invention.

FIG. 8 is an angled view of a microlens array 800 having integrated sensors/microlenses. Transparent lens material 516 can act as a protection layer for the underlying microlenses 802 and sensor array 502. Each microlens 802 corresponds to an underlying sensor element 808, which are supported by substrate 506. Light entering microlens array 800 is directed toward individual sensors in the sensor array by corresponding microlenses 802. The process of making the microlens array allows more light to be received by the sensors, thereby improving image sensitivity and color quality. However, as noted above, microlens array 800 or an individual non-spherical lens does not require an underlying array of sensors.

The present invention allows a microlens array or individual lens having non-spherical or different sized/shaped microlenses/lens to be manufactured easily. In conventional processes for making non-spherical or specially sized or shaped lenses, the lenses are typically shaped and polished manually and sometimes individually. This can be costly in terms of time and effort. On the other hand, spherical lens arrays can be manufactured quickly by using conventional machines. However, the machines do not allow non-spherical lenses to be formed nor do they allow lenses of different shapes or sizes to be formed on the same array. Advantageously, the present invention allows microlens arrays or lenses having non-spherical microlenses or lenses of different shapes or sizes to be made quickly and inexpensively.

Embodiments described above illustrate but do not limit the invention. It should also be understood that numerous modifications and variations are possible in accordance with the principles of the present invention. For example, the above embodiments describe the use of a patterning layer over a dielectric layer. However, the dielectric layer can be excluded if the patterning photosensitive dielectric layer can be directly used to form usable curved recesses or to form the curved recesses using other means such as suitable chemical processes or ion beam sputtering and the like. Accordingly, the scope of the invention is defined only by the following claims.

What is claimed is:

1. A method for making a lens or lens array, comprising:
   providing a substrate;
   depositing a dielectric layer over the substrate;
   depositing a patterning layer over the dielectric layer;
   removing a portion of the patterning layer overlying an area of the dielectric layer corresponding to a to-be-formed lens;
   removing the exposed portion of the dielectric layer to form a curved recess in the exposed portion of the dielectric layer; and
   filling the curved recess with a lens material.

2. The method of claim 1, wherein the removing comprises wet etching.

3. The method of claim 1, wherein the removing comprises exposure through a grey scale or shadow mask.

4. The method of claim 1, further comprising forming an array of sensor elements over the substrate before depositing the dielectric layer.

5. The method of claim 4, wherein the sensor array comprises an array of CMOS sensor elements.

6. The method of claim 4, wherein the sensor array comprises an array of CCD sensor elements.

7. The method of claim 1, wherein the dielectric layer has a lower index of refraction than the lens material.

8. The method of claim 1, wherein the lens material is inorganic.

9. The method of claim 4, wherein the sensor elements underlie an array of to-be-formed microlenses.

10. The method of claim 1, further comprising polishing the lens material.

11. The method of claim 1, further comprising treating and smoothing the curved recess.

12. The method of claim 1, wherein the interface between the curved recess and the lens material has a roughness that is less than the wavelength of visible light.

13. The method of claim 12, wherein the roughness is less than approximately 1/10 the wavelength of the visible light.

14. The method of claim 1, wherein the two removing steps forms a plurality of curved recesses.

15. The method of claim 14, wherein at least one of the curved recesses has a shape different than the other ones of the curved recesses.

16. The method of claim 1, wherein the curved recess is non-spherical.

17. The method of claim 1, further comprising removing remaining portions of the patterning layer after removing the exposed portion of the dielectric layer.

18. The method of claim 1, wherein the lens is a microlens or non-spherical lens.

19. A lens or lens array device, comprising:
   a substrate;
   a dielectric layer over the substrate, wherein the dielectric layer comprises at least one curved recess on the upper surface of the dielectric layer;
   a lens material layer over the dielectric layer; and
   an array of sensor elements between the substrate and the dielectric layer.

20. The device of claim 19, wherein the sensor elements are CMOS or CCD devices.

21. A lens or lens array device, comprising:
a substrate;
a dielectric layer over the substrate, wherein the dielectric layer comprises at least one curved recess on the upper surface of the dielectric layer; and
a lens material layer over the dielectric layer, wherein the lens material layer has a higher index of refraction than the dielectric layer.

22. The device of claim 21, wherein the dielectric layer comprises an array of curved recesses.

23. The device of claim 22, wherein at least one of the curved recesses is non-spherical.

24. A lens or lens array device, comprising:
a substrate;
a dielectric layer over the substrate, wherein the dielectric layer comprises at least one curved recess on the upper surface of the dielectric layer; and
a lens material layer over the dielectric layer, wherein the dielectric layer comprises an array of curved recesses, and wherein at least one of the curved recesses has a shape different than the other ones of the curved recesses.

25. A lens or lens array device, comprising:
a substrate;
a dielectric layer over the substrate, wherein the dielectric layer comprises at least one curved recess on the upper surface of the dielectric layer;
a lens material layer over the dielectric layer, wherein the dielectric layer and lens material layer are formed by deposition.

26. A lens or lens array device, comprising:
a substrate;
a dielectric layer over the substrate, wherein the dielectric layer comprises at least one curved recess on the upper surface of the dielectric layer;
a lens material layer over the dielectric layer, wherein the lens material layer has a polished upper surface.

27. The device of claim 26, wherein the curved recess is non-spherical.

28. The device of claim 26, wherein the curved recess forms a microlens or non-spherical lens.

29. A lens or lens array device, comprising:
a substrate;
a dielectric layer over the substrate, wherein the dielectric layer comprises at least one curved recess on the upper surface of the dielectric layer;
a lens material layer over the dielectric layer, wherein a roughness of the dielectric layer at the interface of the lens material layer is less than the wavelength of visible light.

30. The device of claim 29, wherein the roughness is approximately 1/10 or less of the wavelength of the visible light.

31. A method for manufacturing a lens or lens array, comprising:
providing a substrate;
depositing a dielectric layer over the substrate;
selectively removing a portion of the dielectric layer corresponding to a to-be-formed lens to form a curved recess on the dielectric layer; and
forming a layer of lens material over the dielectric layer.

32. The method of claim 31, further comprising forming a sensor array over the substrate before depositing the dielectric layer.

33. The method of claim 31, wherein the refractive index of the lens material is higher than that of the dielectric layer.

34. The method of claim 31, wherein the to-be-formed lens is a microlens.

35. The method of claim 31, wherein the to-be-formed lens is non-spherical.

36. The method of claim 31, wherein the forming comprises depositing the lens material to fill the curved recess.

37. The method of claim 31, wherein the forming comprises using the dielectric layer with the curved recess as a molding template.

38. A method of forming a molding for making a lens, comprising:
providing a substrate;
depositing a dielectric layer over the substrate;
depositing a patterning layer over the dielectric layer;
removing a portion of the patterning layer overlying an area of the dielectric layer corresponding to a to-be-formed lens; and
removing the exposed portion of the dielectric layer to form a curved recess in the exposed portion of the dielectric layer.

39. The method of claim 38, wherein the to-be-formed lens comprises a microlens or a non-spherical lens.

* * * * *